(12) United States Patent
Gautam et al.

(10) Patent No.: US 9,460,806 B2
(45) Date of Patent: Oct. 4, 2016

(54) METHOD FOR CREATING AN OTPROM ARRAY POSSESSING MULTI-BIT CAPACITY WITH TDDB STRESS RELIABILITY MECHANISM

(71) Applicant: GLOBALFOUNDRIES Inc., Grand Cayman (KY)

(72) Inventors: Akhilesh Gautam, Clifton Park, NY (US); Suresh Uppal, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 28 days.

(21) Appl. No.: 14/680,228

(22) Filed: Apr. 7, 2015

(65) Prior Publication Data

US 2016/0163398 A1 Jun. 9, 2016

Related U.S. Application Data

(60) Provisional application No. 62/088,144, filed on Dec. 5, 2014.

(51) Int. Cl.
*H01L 27/112* (2006.01)
*H01L 21/66* (2006.01)
*G11C 17/12* (2006.01)
*G01R 31/26* (2014.01)

(52) U.S. Cl.
CPC ......... *G11C 17/12* (2013.01); *H01L 27/11206* (2013.01); *G01R 31/26* (2013.01); *H01L 22/34* (2013.01)

(58) Field of Classification Search
CPC . H01L 22/34; H01L 27/11206; H01L 21/66; G01R 31/26; G11C 17/12
See application file for complete search history.

(56) References Cited

U.S. PATENT DOCUMENTS

| 6,574,145 | B2* | 6/2003 | Kleveland | G11C 7/062 365/185.14 |
| 8,875,070 | B2* | 10/2014 | Bell | G06F 17/5009 716/100 |
| 9,335,365 | B2* | 5/2016 | Huang | G11C 16/0425 |

* cited by examiner

*Primary Examiner* — John C Ingham
(74) *Attorney, Agent, or Firm* — Ditthavong & Steiner, P.C.

(57) ABSTRACT

A method of forming an OTPROM capable of storing twice the number of bits as a conventional OTPROM without increasing the overall size of the device is provided. Embodiments include forming a OTPROM, the OTPROM array having a plurality of formed devices; receiving a binary code to program the OTPROM array; separating the binary code into a first part and a second part; programming each device with one of four data storage states by: forming a gate oxide layer of each device to a thickness corresponding to the first part of the binary code, and selectively applying a TDDB stress to the gate oxide layer corresponding to the second part of the binary code; detecting a Idsat level discharged by each device with a multi-bit sense amplifier; and reading the state of each device based on the detected Idsat level.

20 Claims, 3 Drawing Sheets

US 9,460,806 B2

METHOD FOR CREATING AN OTPROM ARRAY POSSESSING MULTI-BIT CAPACITY WITH TDDB STRESS RELIABILITY MECHANISM

TECHNICAL FIELD

The present disclosure relates to memory design for semiconductor devices. The present disclosure is particularly applicable to fabricating a one-time programmable read only memory (OTPROM) array.

BACKGROUND

An OTPROM is used in an application-specific integrated circuit (ASIC) for the purpose of storing boot code of a system or it can be used as a look-up table. The most common OTPROM, a NAND type, is formed of an array of n-type field effect transistors (NFETs), as depicted in FIG. 1. Adverting to FIG. 1, drain terminals 101 of storage devices 103 through 133, e.g., NFETs, in the same column are connected to the same bit line of bit lines 135, 137, 139, and 141. For example, storage devices 103, 111, 119, and 127 are connected to bit line 135. Similarly, gate terminals 143 of storage devices 103 through 133 in the same row are connected to the same word line of word lines 145, 147, 149, 151. For example, storage devices 103, 105, 107, and 109 are all connected to word line 145. Also, source terminals 153 are connected to ground supply 155, 157, 159, and 161, respectively. Each drain terminal 101 is programmed and, therefore, stores either a 0 or a 1. Consequently, when a storage device 103 through 133 is uniquely selected, the selected device of devices 103 through 133 either gives current in the micro amp (μA) range or a comparatively negligible current. Also, one binary sense amp resolves one bit line, e.g., bit line 135, and stores the data read.

A known approach for programming an OTPROM includes using gate oxide thickness of the core devices as a programming method, i.e., storing either a 0 or a 1 at any one device. Another known approach for programming an OTPROM is to make use of one of the reliability effects in metal-oxide-semiconductor field-effect transistor (MOSFET) devices. In particular, a time-dependent dielectric breakdown (TDDB) stress can be applied to the gate oxide layer of a storage device as a programming method. Each of the above methods results in two possible levels of bit line read current that can be read and stored by any conventional sense amplifier. However, an OTPROM array as depicted in FIG. 1 tends to consume a lot of area on a chip because of the largely repeated devices 103 through 133, with one device storing only one bit of memory.

A need therefore exists for methodology enabling an increasing of the storage capacity of an OTPROM array without requiring additional area on a chip.

SUMMARY

An aspect of the present disclosure is a method of forming an OTPROM array capable of storing twice the number of bits as a conventional OTPROM array without increasing the overall size of the device.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a OTPROM, the OTPROM array having a plurality of formed devices; receiving a binary code to program the OTPROM array; separating the binary code into a first part and a second part; programming each device with one of four data storage states by: forming a gate oxide layer of each device to a thickness corresponding to the first part of the binary code, and selectively applying a TDDB stress to the gate oxide layer corresponding to the second part of the binary code; detecting a drain saturation current (Idsat) level discharged by each device with a multi-bit sense amplifier; and reading the state of each device based on the detected Idsat level.

Aspects of the present disclosure include forming each device as an n-type field effect transistor (NFET) to form a NAND type OTPROM. Other aspects include separating the binary code so that the first part and the second part each have a resulting aspect ratio substantially equal to a square. Further aspects include forming additional layers after forming the gate oxide layer of each device; and selectively applying the TDDB stress to each device after forming the additional layers, wherein whether the TDDB is applied to each device corresponds to first and second values of a bit of the second part of the binary code. Another aspect includes forming the gate oxide layer of each device to a first thickness or a second thickness, the first thickness being greater than the second thickness, the first and second thicknesses corresponding to first and second values, respectively, of a bit of the first part of the binary code. Additional aspects include reading a first of the four data storage states of the device (00) based on a first Idsat ($I_{read0}$) corresponding to a device with a gate oxide layer having the first thickness and no applied TDDB stress. Other aspects include reading a second of the four data storage states of the device (01) based on a second Idsat ($I_{read1}$) corresponding with a device with a gate oxide layer having the second thickness and no applied TDDB stress. Further aspects include reading a third of the four data storage states of the device (10) based on a third Idsat ($I_{read2}$) corresponding to a device with a gate oxide layer having the first thickness and an applied TDDB stress. Another aspect includes reading a fourth of the four data storage states of the device (11) based on a fourth Idsat ($I_{read3}$) corresponding to a device with a gate oxide layer having the second thickness and an applied TDDB stress.

Another aspect of the present disclosure is a method including: forming a NAND type OTPROM, the OTPROM array having a plurality of NFETs; receiving a binary code to program the OTPROM array; separating the binary code into a first part and a second part, the first part and the second part each having a resulting aspect ratio substantially equal to a square; programming each NFET with one of four data storage states by: forming a gate oxide layer of each NFET to a thickness corresponding to the first part; forming additional layers after forming the gate layer of each device; and selectively applying a TDDB stress to each NFET after forming the additional layers, wherein whether the TDDB stress is applied to each device corresponds to first and second values of a bit of the second part of the binary code; detecting a Idsat level discharged by each NFET with a multi-bit sense amplifier; and reading the state of each NFET based on the detected Idsat level.

Aspects of the present disclosure include forming the gate oxide layer of each device to a first thickness or a second thickness, the first thickness being greater than the second thickness, the first and second thicknesses corresponding to first and second values, respectively of a bit of the first part of the binary code. Other aspects include reading a first of the four data storage states of the NFET (00) based on $I_{read0}$ corresponding to a gate oxide layer having the first thickness and no applied TDDB stress. Further aspects include comprising reading a second of the four data storage states of the NFET (01) based on $I_{read1}$ corresponding to a gate oxide layer having the second thickness and no applied TDDB stress. Another aspect includes reading a third of the four data storage states of the NFET (10) based on $I_{read2}$ corresponding to a gate oxide layer having the first thickness and an applied TDDB stress. Additional aspects include reading a fourth of the four data storage states of the NFET (11) based on $I_{read3}$ corresponding to a gate oxide layer having the second thickness and an applied TDDB.

A further aspect of the present disclosure is a method including: forming a NAND type OTPROM array, the OTPROM array having a plurality of NFETs; receiving a binary code to program the OTPROM array; separating the binary code into a first part and a second part so that the first part and the second part having a resulting aspect ratio substantially equal to a square; programming each NFET with one of four data storage states by: forming a gate oxide layer of each NFET to a first thickness or a second thickness, the first and second thicknesses corresponding to first and second values, respectively, of a bit of the first part of the binary code; forming additional layers after forming the gate layer of each device; and selectively applying a TDDB stress to each NFET after forming the additional layers, wherein whether the TDDB stress is applied to each NFET corresponds to the first and second values of a bit of the second part of the binary code; detecting a Idsat level discharged by each NFET with a multi-bit sense amplifier; and reading the state of each NFET based on the detected Idsat level.

Aspects of the present disclosure include reading the first of the four data storages of the NFET (00) based on $I_{read0}$ corresponding to an NFET with a gate oxide layer having the first thickness and no applied TDDB stress. Other aspects include reading the second of the four data storage states of the NFET (01) based on $I_{read1}$ corresponding to an NFET with a gate oxide layer having the second thickness and no applied TDDB stress. Another aspect includes reading the third of the four data storage states of the NFET (10) based on $I_{read2}$ corresponding to an NFET with a gate oxide layer having the first thickness and an applied TDDB stress. Additional aspects include reading the fourth of the four data storage states of the NFET (11) based on $I_{read3}$ corresponding to an NFET with a gate oxide layer having the second thickness and an applied TDDB stress.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of increased chip area requirements attendant upon increasing the storage capacity of an OTPROM array.

Methodology in accordance with embodiments of the present disclosure includes forming an OTPROM, the OTPROM array having a plurality of formed devices. A binary code is received to program the OTPROM array. The binary code is separated into a first part and a second part. Each device is programmed with one of four data storage states by: forming a gate oxide layer of each device to a thickness corresponding to the first part of the binary code, and selectively applying a TDDB stress to the gate oxide layer corresponding to the second part of the binary code. An Idsat level discharged by each device is detected with a multi-bit sense amplifier and the state of each device is read based on the detected Idsat level.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
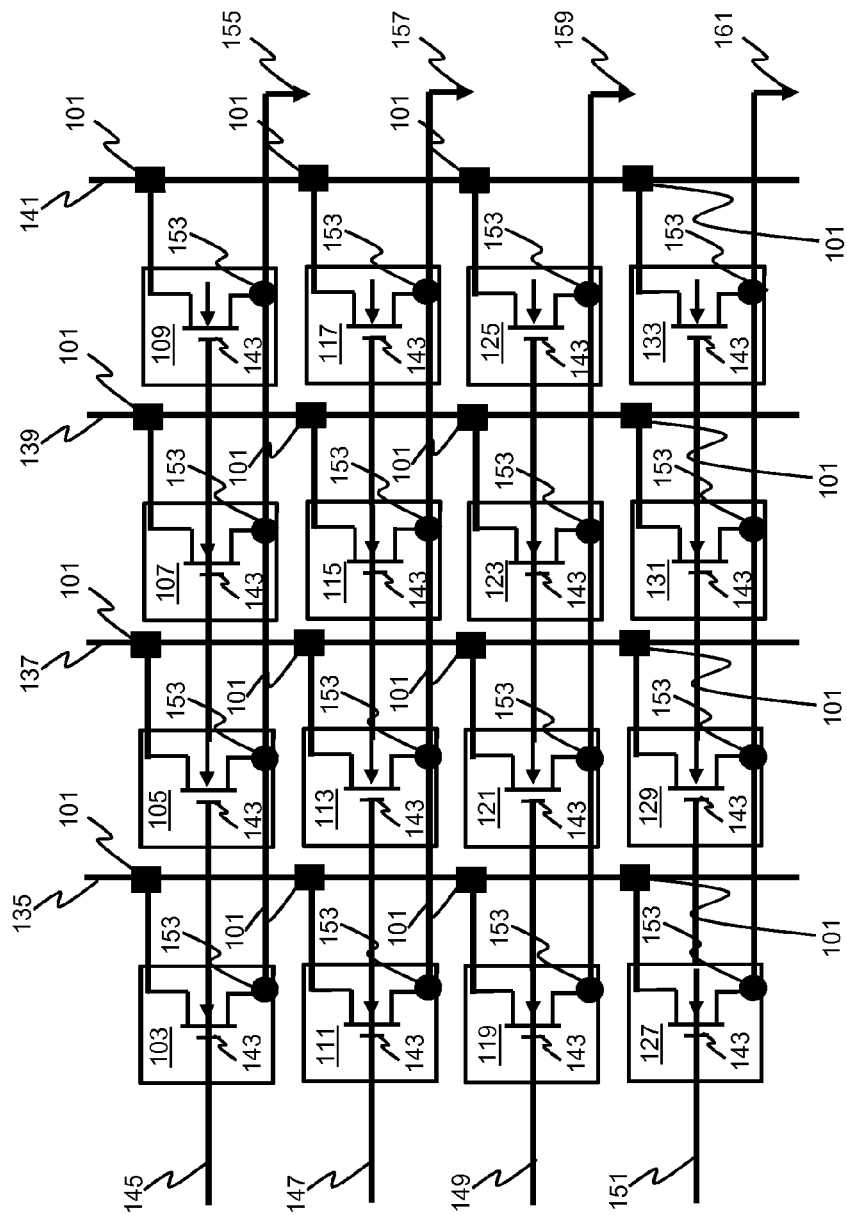
FIG. 1 schematically illustrates a background NAND type OTPROM array.
Figure 2:
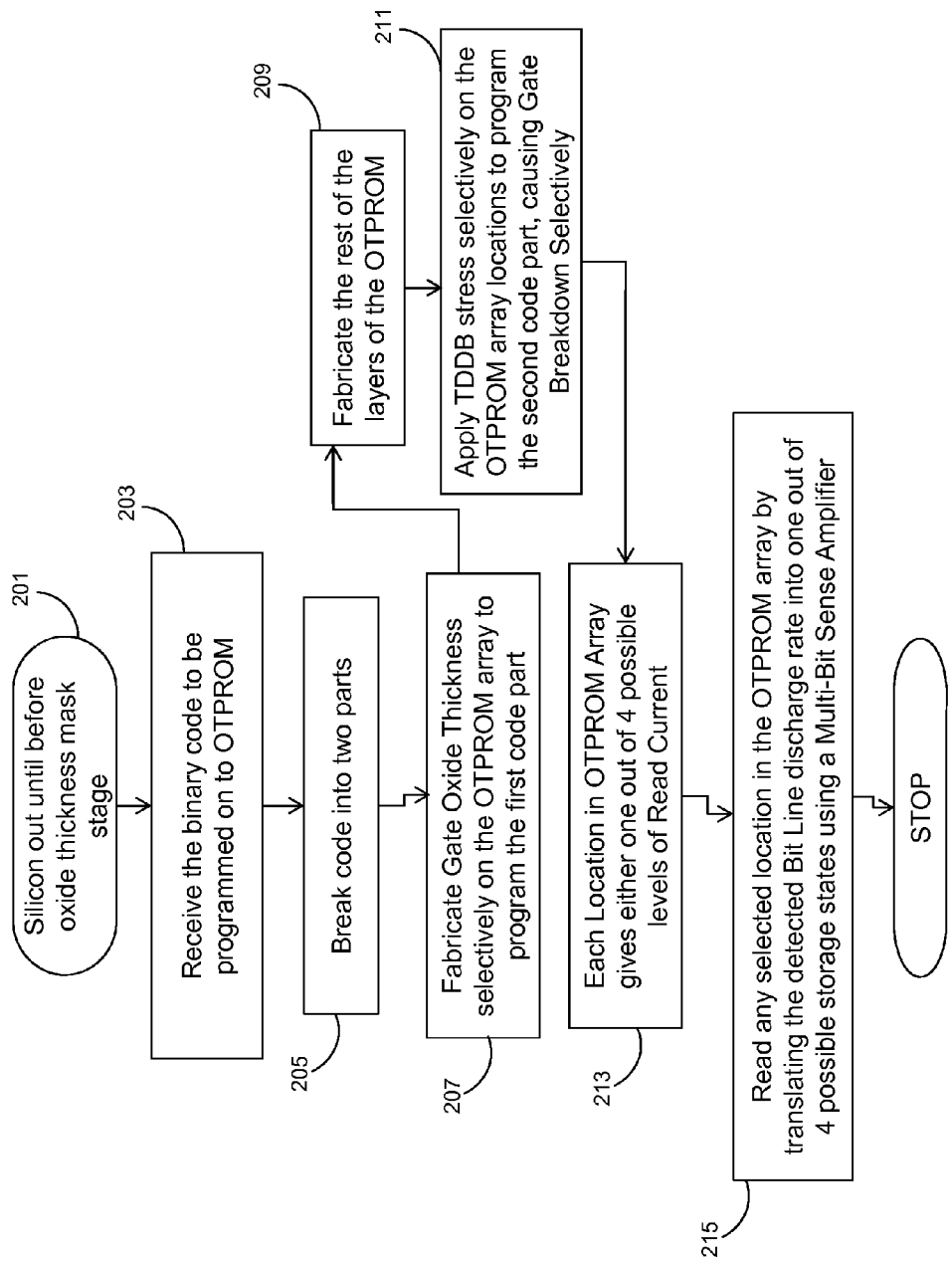
FIG. 2 illustrates an OTPROM array formation flow based on gate oxide thickness and TDDB stress programming, in accordance with an exemplary embodiment.

Adverting to FIG. 2, in step 201, all of the layers of an OTPROM array below the gate oxide layer of each device, e.g., an NFET, are first formed. In step 203, a binary code is received, for example, from a customer that wants to use the OTPROM in a particular ASIC. In step 205, the binary code is separated into two parts. The binary code maybe separated, for example, horizontally or vertically. In particular, the binary code maybe separated, for example, so that a square design is formed rather than a rectangle since a square design requires less space on a chip.

Based on the binary code, each device 103 through 133 may be programmed, for example, with one of four data storage states, e.g., (00), (01), (10), or (11). In step 207, one half of the binary code maybe programmed, for example, by forming the gate oxide layer of each device 103 through 133 to a particular thickness, e.g., a thick or a thin layer, corresponding to each bit, respectively, of the first half of the binary code. In particular, the thickness of the gate oxide layer programs each drain terminal 101 of the devices 103 through 133 with either a 0 or a 1. In step 209, any subsequent layers to be formed on each device 103 through 133 after the gate oxide layer may now be formed, for example.

In step 211, a TDDB stress maybe selectively applied, for example, to the gate oxide layer of each device 103 through 133 corresponding to each bit, respectively, of the second half of the binary code. In particular, whether or not the TBBD stress is applied to each device 103 through 133 and, therefore, whether the gate layer oxide of each device 103 through 133 breaks down, programs each device 103 through 133 a second time with either a 0 or a 1. Consequently, in step 213, when a device 103 through 133 is uniquely selected, the selected device 103 through 133 can discharge one of four Idsat levels, e.g., $I_{read0}$, $I_{read1}$, $I_{read2}$, or $I_{read3}$, which is detected by a multi-bit sense amplifier (not shown for illustrative convenience).

Figure 3:
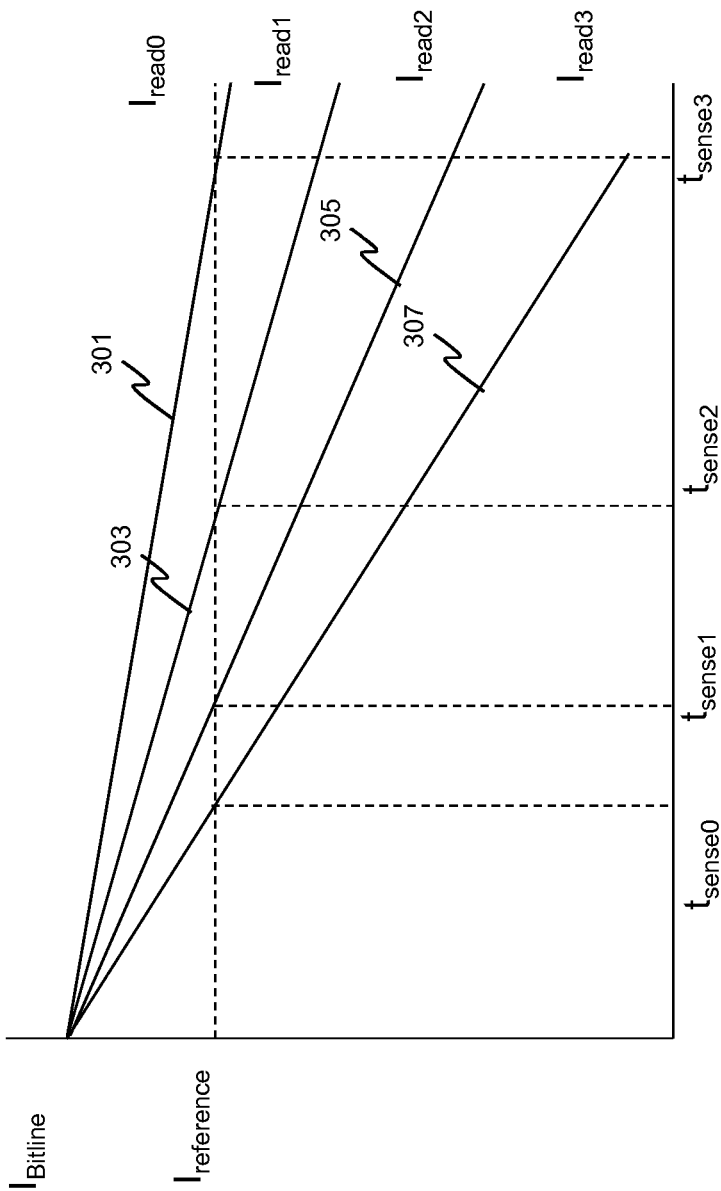
FIG. 3 illustrates the rate of time or sense time ($t_{sense}$) for a particular discharged Idsat to be detected by a multi-bit sense amplifier, in accordance with an exemplary embodiment.

In step 215, the multi-bit sense amplifier may read and translate the detected Idsat level to determine the state of each device 103 through 133, as depicted in FIG. 3. In particular, the multi-bit sense amplifier may read, for example, the first of the four data storage states (00) based on $I_{read0}$ corresponding to one of devices 103 through 133 having a thick oxide layer and no applied TDDB stress. Consequently, $I_{read0}$ (line 301) corresponds to the lowest current and, therefore, slowest $t_{sense}$. The multi-bit sense amplifier may read, for example, the second of the four data storage states (01) based on $I_{read1}$ corresponding to one of devices 103 through 133 having a thin oxide layer and no applied TDDB stress. As a result, $I_{read1}$ (line 303) corresponds to a current slightly higher and, therefore, faster $t_{sense}$ than that of $I_{read0}$ (line 301). Further, the multi-bit sense amplifier may read, for example, the third of the four data storage states (10) based on $I_{read2}$ corresponding to one of devices 103 through 133 having a thick oxide layer and an applied TDDB stress. Consequently, $I_{read2}$ (line 305) corresponds to a current higher and faster $t_{sense}$ than that of $I_{read0}$ (line 301) and $I_{read1}$ (line 303). Last, the multi-bit sense amplifier may read, for example, the fourth of the four data storage states (11) based on $I_{read3}$ corresponding to one of devices 103 through 133 having a thin oxide layer and an applied TDDB stress. Therefore, $I_{read3}$ (line 307) corresponds to the highest current and, therefore, fastest $t_{sense}$.

The embodiments of the present disclosure can achieve several technical effects including storing twice the number of bits than a conventional OTPROM array without increasing the amount of required space on a chip. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various highly integrated semiconductor devices including an OTPROM.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a one-time programmable read-only memory (OTPROM), the OTPROM array having a plurality of formed devices;
    receiving a binary code to program the OTPROM array;
    separating the binary code into a first part and a second part;
    programming each device with one of four data storage states by:
        forming a gate oxide layer of each device to a thickness corresponding to the first part of the binary code, and
        selectively applying a time dependent dielectric breakdown (TDDB) stress to the gate oxide layer corresponding to the second part of the binary code;
    detecting a drain saturation current (Idsat) level discharged by each device with a multi-bit sense amplifier; and
    reading the state of each device based on the detected Idsat level.

2. The method according to claim 1, comprising forming each device as an n-type field effect transistor (NFET) to form a NAND type OTPROM.

3. The method according to claim 1, comprising separating the binary code so that the first part and the second part each have a resulting aspect ratio substantially equal to a square.

4. The method according to claim 1, comprising
    forming additional layers after forming the gate oxide layer of each device; and
    selectively applying the TDDB stress to each device after forming the additional layers, wherein whether the TDDB is applied to each device corresponds to first and second values of a bit of the second part of the binary code.

5. The method according to claim 1, comprising forming the gate oxide layer of each device to a first thickness or a second thickness, the first thickness being greater than the second thickness, the first and second thicknesses corresponding to first and second values, respectively, of a bit of the first part of the binary code.

6. The method according to claim 5, comprising reading a first of the four data storage states of the device (00) based on a first Idsat ($I_{read0}$) corresponding to a device with a gate oxide layer having the first thickness and no applied TDDB stress.

7. The method according to claim 6, comprising reading a second of the four data storage states of the device (01) based on a second Idsat ($I_{read1}$) corresponding with a device with a gate oxide layer having the second thickness and no applied TDDB stress.

8. The method according to claim 6, comprising reading a third of the four data storage states of the device (10) based on a third Idsat ($I_{read2}$) corresponding to a device with a gate oxide layer having the first thickness and an applied TDDB stress.

9. The method according to claim 6, comprising reading a fourth of the four data storage states of the device (11) based on a fourth Idsat ($I_{read3}$) corresponding to a device with a gate oxide layer having the second thickness and an applied TDDB stress.

10. A method comprising:
forming a NAND type one-time programmable read-only memory (OTPROM), the OTPROM array having a plurality of n-type field effect transistors (NFETs);
receiving a binary code to program the OTPROM array;
separating the binary code into a first part and a second part, the first part and the second part each having a resulting aspect ratio substantially equal to a square;
programming each NFET with one of four data storage states by:
  forming a gate oxide layer of each NFET to a thickness corresponding to the first part;
  forming additional layers after forming the gate layer of each device; and
  selectively applying a time dependent dielectric breakdown (TDDB) stress to each NFET after forming the additional layers, wherein whether the TDDB stress is applied to each device corresponds to first and second values of a bit of the second part of the binary code;
detecting a drain saturation current (Idsat) level discharged by each NFET with a multi-bit sense amplifier; and
reading the state of each NFET based on the detected Idsat level.

11. The method according to claim 10, comprising forming the gate oxide layer of each device to a first thickness or a second thickness, the first thickness being greater than the second thickness, the first and second thicknesses corresponding to first and second values, respectively of a bit of the first part of the binary code.

12. The method according to claim 11, comprising reading a first of the four data storage states of the NFET (00) based on a first Idsat ($I_{read0}$) corresponding to a gate oxide layer having the first thickness and no applied TDDB stress.

13. The method according to claim 11, comprising reading a second of the four data storage states of the NFET (01) based on a second Idsat ($I_{read1}$) corresponding to a gate oxide layer having the second thickness and no applied TDDB stress.

14. The method according to claim 11, comprising reading a third of the four data storage states of the NFET (10) based on a third Idsat ($I_{read2}$) corresponding to a gate oxide layer having the first thickness and an applied TDDB stress.

15. The method according to claim 11, comprising reading a fourth of the four data storage states of the NFET (11) based on a fourth Idsat ($I_{read3}$) corresponding to a gate oxide layer having the second thickness and an applied TDDB.

16. A method comprising:
forming a NAND type one-time programmable read-only memory (OTPROM) array, the OTPROM array having a plurality of n-type field effect transistors (NFETs);
receiving a binary code to program the OTPROM array;
separating the binary code into a first part and a second part so that the first part and the second part having a resulting aspect ratio substantially equal to a square;
programming each NFET with one of four data storage states by:
  forming a gate oxide layer of each NFET to a first thickness or a second thickness, the first and second thicknesses corresponding to first and second values, respectively, of a bit of the first part of the binary code;
  forming additional layers after forming the gate layer of each device; and
  selectively applying a time dependent dielectric breakdown (TDDB) stress to each NFET after forming the additional layers, wherein whether the TDDB stress is applied to each NFET corresponds to the first and second values of a bit of the second part of the binary code;
detecting a drain saturation current (Idsat) level discharged by each NFET with a multi-bit sense amplifier; and
reading the state of each NFET based on the detected Idsat level.

17. The method according to claim 16, comprising reading the first of the four data storages of the NFET (00) based on a first Idsat ($I_{read0}$) corresponding to an NFET with a gate oxide layer having the first thickness and no applied TDDB stress.

18. The method according to claim 16, comprising reading the second of the four data storage states of the NFET (01) based on a second Idsat ($I_{read1}$) corresponding to an NFET with a gate oxide layer having the second thickness and no applied TDDB stress.

19. The method according to claim 16, comprising reading the third of the four data storage states of the NFET (10) based on a third Idsat ($I_{read2}$) corresponding to an NFET with a gate oxide layer having the first thickness and an applied TDDB stress.

20. The method according to claim 16, comprising reading the fourth of the four data storage states of the NFET (11) based on a fourth Idsat ($I_{read3}$) corresponding to an NFET with a gate oxide layer having the second thickness and an applied TDDB stress.

* * * * *